United States Patent
Kim et al.

(10) Patent No.: US 8,699,234 B2
(45) Date of Patent: Apr. 15, 2014

(54) EMI NOISE SHIELD BOARD INCLUDING ELECTROMAGNETIC BANDGAP STRUCTURE

(75) Inventors: Han Kim, Yongin-si (KR); Mi-Ja Han, Jeonju-si (KR); Dae-Hyun Park, Ulsan (KR); Hyo-Jic Jung, Daejeon (KR); Kang-Wook Bong, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 385 days.

(21) Appl. No.: 12/984,935

(22) Filed: Jan. 5, 2011

(65) Prior Publication Data

US 2011/0299264 A1 Dec. 8, 2011

(30) Foreign Application Priority Data

Jun. 8, 2010 (KR) .................. 10-2010-0054057

(51) Int. Cl.
*H05K 1/18* (2006.01)

(52) U.S. Cl.
USPC ........... 361/763; 361/765; 361/782; 361/784; 343/700 MS

(58) Field of Classification Search
USPC ............ 361/763–765, 782–784; 343/700 MS
See application file for complete search history.

(56) References Cited

U.S. PATENT DOCUMENTS

| | | | |
|---|---|---|---|
| 6,483,045 B1 * | 11/2002 | Wang et al. | 174/264 |
| 7,136,029 B2 * | 11/2006 | Ramprasad et al. | 343/909 |
| 8,159,413 B2 * | 4/2012 | Park et al. | 343/909 |
| 2008/0002380 A1 * | 1/2008 | Hazucha et al. | 361/760 |
| 2009/0039984 A1 | 2/2009 | Kim et al. | |
| 2010/0053013 A1 * | 3/2010 | Konishi et al. | 343/772 |

FOREIGN PATENT DOCUMENTS

| | | |
|---|---|---|
| CN | 101365293 A | 2/2009 |
| JP | 2009-044151 | 2/2009 |
| WO | 2009/082003 A1 | 7/2009 |

OTHER PUBLICATIONS

Korean Office Action, w/ partial English translation thereof, issued in Korean Patent Application No. KR 10-2010-0054057 dated Jun. 3, 2011.
Japanese Office Action, w/ partial English translation, issued in Japanese Patent Application No. 2010-203868 dated Jul. 9, 2013.
Chinese Office Action, w/ English translation thereof, issued in Chinese Patent Application No. CN 201010288237.6 dated Jul. 12, 2013.

* cited by examiner

*Primary Examiner* — Tuan T Dinh
(74) *Attorney, Agent, or Firm* — McDermott Will & Emery LLP

(57) ABSTRACT

An EMI noise shield board, in which an EBG structure is inserted, includes a first board portion and a second board portion. The first board portion has an upper surface, on which an electronic part is disposed, and a circuit for transferring a signal and power to the electronic part. The second board portion is located on a lower surface of the first board portion. The electromagnetic bandgap structure is inserted into the second board portion, and has a band stop frequency property such that an EMI noise transferred from the first board portion is shielded from being radiated to the outside of the EMI noise shield board.

8 Claims, 15 Drawing Sheets

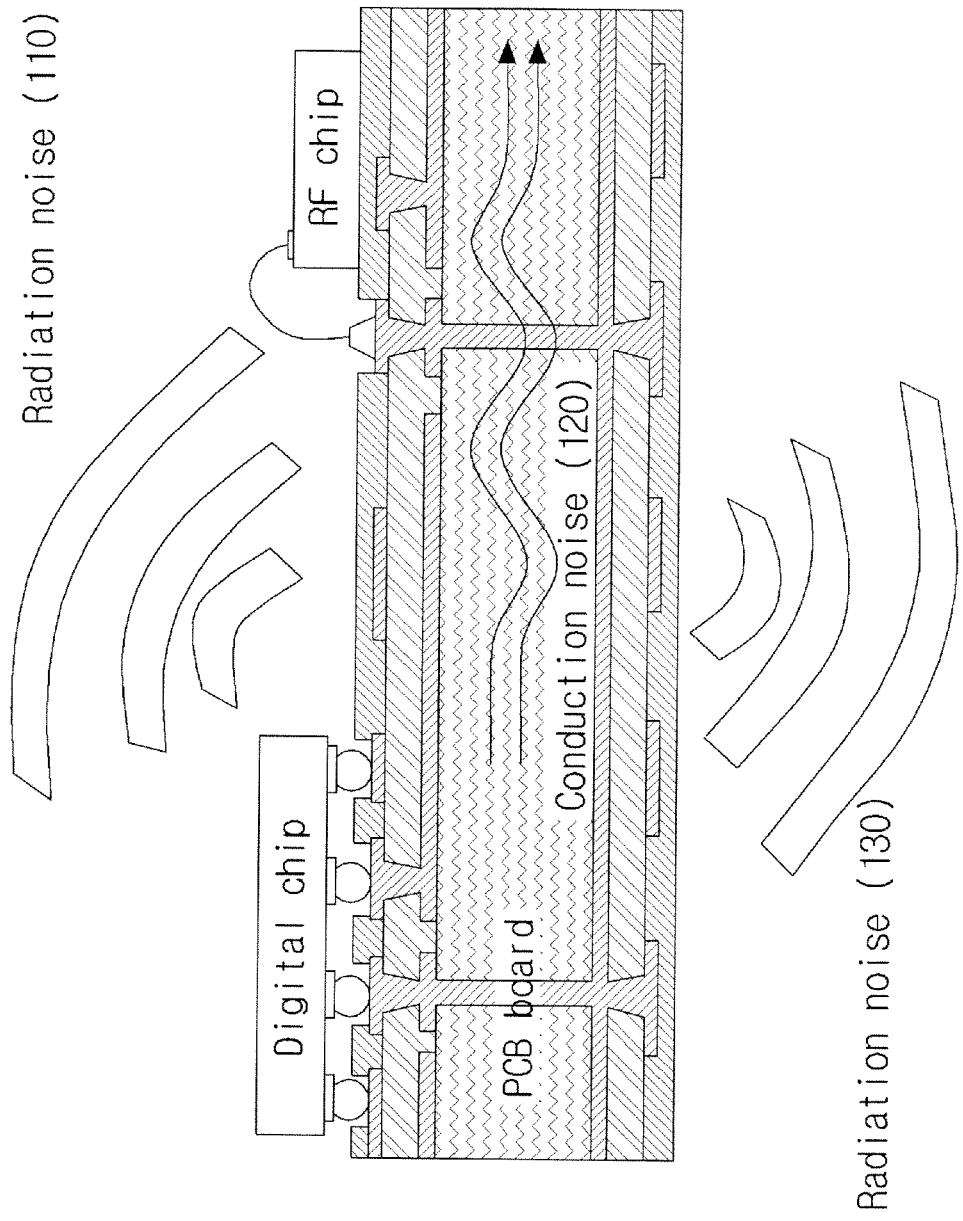

EMI NOISE SHIELD BOARD INCLUDING ELECTROMAGNETIC BANDGAP STRUCTURE

CROSS-REFERENCE TO RELATED APPLICATIONS

This application claims the benefit of Korean Patent Application No. 10-2010-0054057, filed with the Korean Intellectual Property Office on Jun. 8, 2010, the disclosure of which is incorporated herein by reference in its entirety.

BACKGROUND

1. Technical Field

The present invention is related to a board, more specifically to a board a noise shield board that can shield an electromagnetic interference noise by use of an electromagnetic bandgap structure.

2. Description of the Related Art

As the operating frequencies of electronic products become higher, electromagnetic interference (EMI) has become a chronic noise problem. Particularly, as the recent electronic products are operated in a double-digit MHz to a few GHz, the EMI problem has become increasingly serious, making it urgent to find a solution.

An EMI noise refers to a noise that causes a noise problem generated by interference when electromagnetic waves generated in one electronic circuit, device or part is transferred to another electronic circuit, device or part. The EMI noise can be mainly classified into a radiation noise (see reference numerals 110 and 130 in FIG. 1A) and a conduction noise (see reference numeral 120 in FIG. 1A).

In the case of the radiation noise 110 that is radiated through an upper part of a board (i.e., a surface on which an electronic part is mounted), the noise problem is commonly solved by shielding the upper part of the board with an electromagnetic shielding cap, such as a metal cap, or by installing an EMI absorbent on the upper part of the board. However, since it is not possible to install the shield can (see reference numeral 30 in FIG. 1B) or EMI absorbent (see reference numeral 35 in FIG. 1B) on the surface where no electronic part is mounted (i.e., a lower surface of the board shown in FIG. 1B), the shield can or EMI absorbent can not be a solution for shielding the radiation noise 130 radiated to the outside through a surface where no electronic part is mounted.

SUMMARY

The present invention provides an EMI noise shield board that can shield a radiation noise radiated to the outside through a surface where no electronic part is mounted, by using an EBG structure.

The present invention also provides an EMI noise shield board that can shield a radiation noise radiated to the outside, by inserting an EBG structure inside a board on the side of a surface where no electronic part is mounted.

An aspect of the present invention provides an EMI noise shield board in which an EBG structure is inserted.

The EMI noise shield board in accordance with an embodiment of the present invention can include: a first board portion, an electronic part being mounted on an upper surface of the first board portion, a circuit for transferring a signal and power to the electronic part being in the first board portion; and a second board portion located on a lower surface of the first board portion, an electromagnetic bandgap structure being inserted into the second board portion, the electromagnetic bandgap structure having a band stop frequency property in such a way that an EMI noise transferred from the first board portion can be shielded from being radiated to the outside of a board.

Here, the electromagnetic bandgap structure can include a plurality of conductive plates located on a first planar surface and stitching vias electrically connecting two neighboring conductive plates with each other. The stitching vias can include: a first via penetrating a dielectric layer, one end of the first via being connected with one of the two neighboring conductive plates; a second via penetrating a dielectric layer, one end of the second via being connected with the other of the two neighboring conductive plates; and a conductive connection pattern located on a planar surface that is different from the conductive plates, one end of the conductive connection pattern being connected with the other end of the first via and the other end of the conductive connection pattern being connected with the other end of the second via.

The first planar surface on which the conductive plates are located can be located farther away from an upper surface of the first board portion on which the electronic part is mounted than a planar surface on which the conductive connection pattern is located in the second board portion.

The dielectric layer being penetrated by one of the first via and the second via can be formed by a high dielectric.

The conductive plates can be located inside the second board portion, and the conductive connection pattern can be located at an interface between the first board portion and the second board portion or on one planar surface inside the first board portion.

The electromagnetic bandgap structure can have a two-layer structure in which the first planar surface on which the conductive plates are located forms a first layer and the planar surface on which the conductive connection pattern is located forms a second layer, and the electromagnetic bandgap structure having the two-layer structure can be expanded in any even-numbered layer structure by being stacked in the direction of height inside the second board portion.

The electromagnetic bandgap structure can have a structure with at least three layers by interposing at least one conductive layer between the first planar surface on which the conductive plates are located and the planar surface on which the conductive connection pattern is located.

Some of the conductive plates can have at least one of an area, a shape and a size that is different from that of the rest of the conductive plates.

The conductive plates can be arranged throughout the entire second board portion. Alternatively, the conductive plates can be arranged at some portion of the second board portion, and the some portion of the second board portion in which the conductive plates are arranged includes a major transfer path of the EMI noise transferred from the first board portion.

The EMI noise board can also include a third board portion located on a lower surface of the second board portion, an electromagnetic bandgap structure being inserted into the third board portion, the electromagnetic bandgap structure having a band stop frequency property in such a way that an EMI noise transferred from the second board portion can be shielded from being radiated to the outside of the board

BRIEF DESCRIPTION OF THE DRAWINGS

FIG. 1A is a diagram for illustrating an EMI noise problem.

DETAILED DESCRIPTION

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention.

Throughout the description of the present invention, when describing a certain known related technology is determined to evade the point of the present invention, the pertinent detailed description will be omitted. Terms such as "first" and "second" are used only to distinguish one element from the other.

Moreover, when an element is described to be "connected" or "accessed" to another element, it shall be appreciated that, although the one element can be connected or accessed to the other element directly, it is possible that the one element is connected or accessed to the other element by way of another element, unless otherwise stated.

Although a metal layer, a metal plate and a metal trace are used throughout the description of an electromagnetic bandgap structure of the present invention, it shall be evidently understood by any person of ordinary skill in the art that any other conductive layers, conductive plates and conductive traces can be substituted for the metal layer, the metal plate and the metal trace.

Hereinafter, prior to describing an EMI noise shield board in accordance with some embodiments of the present invention, electromagnetic bandgap (EBG) structures shown in FIG. 2A to FIG. 4C will be described for easier understanding of the present invention.

The EBG structure that can shield signals of a particular frequency band is mainly classified into an MT-EBG (Mushroom type EBG), a PT-EBG (Planar type EBG) and a VS-EBG (Via stitched type EBG). Particularly, the VS-EBG structure is a peculiar model of Samsung Electro-Mechanics Co., Ltd. that is developed by the applicant of the present invention with respect to the present invention.

Figure 1B:
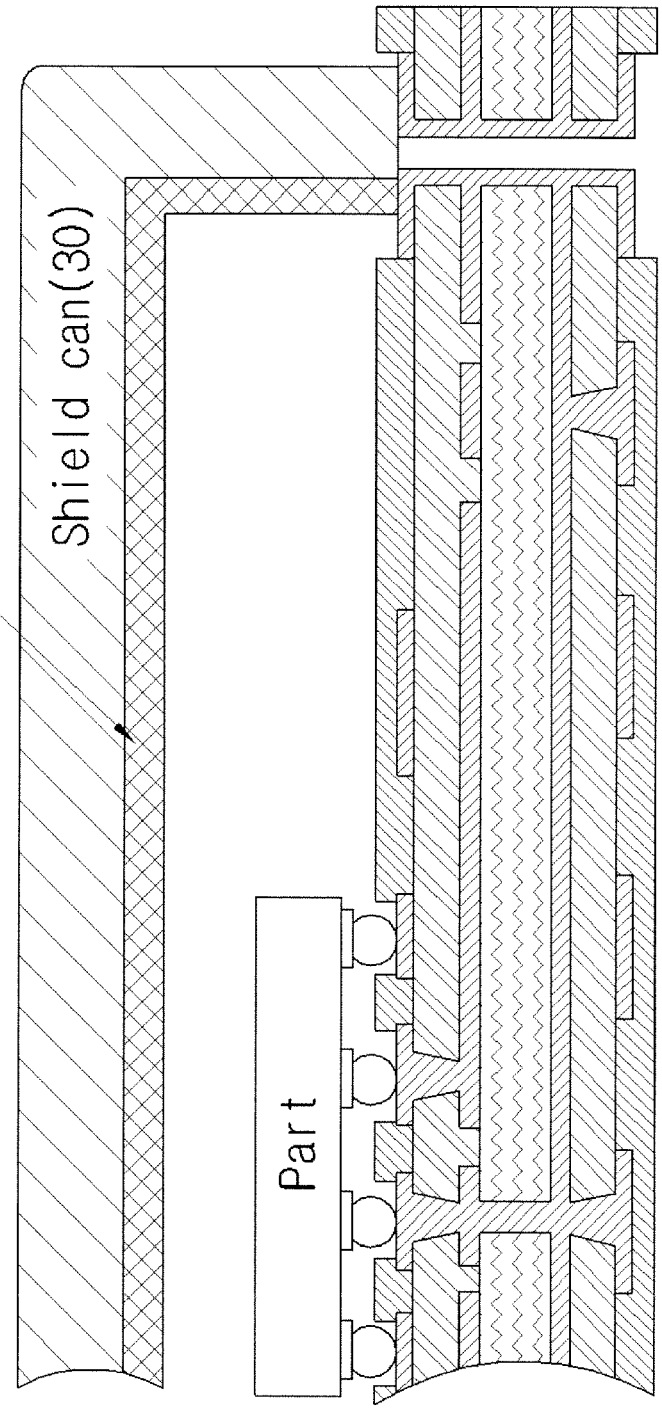
FIG. 1B is a diagram illustrating a board in which a shield can and an EMI absorbent are applied.
Figure 2A:
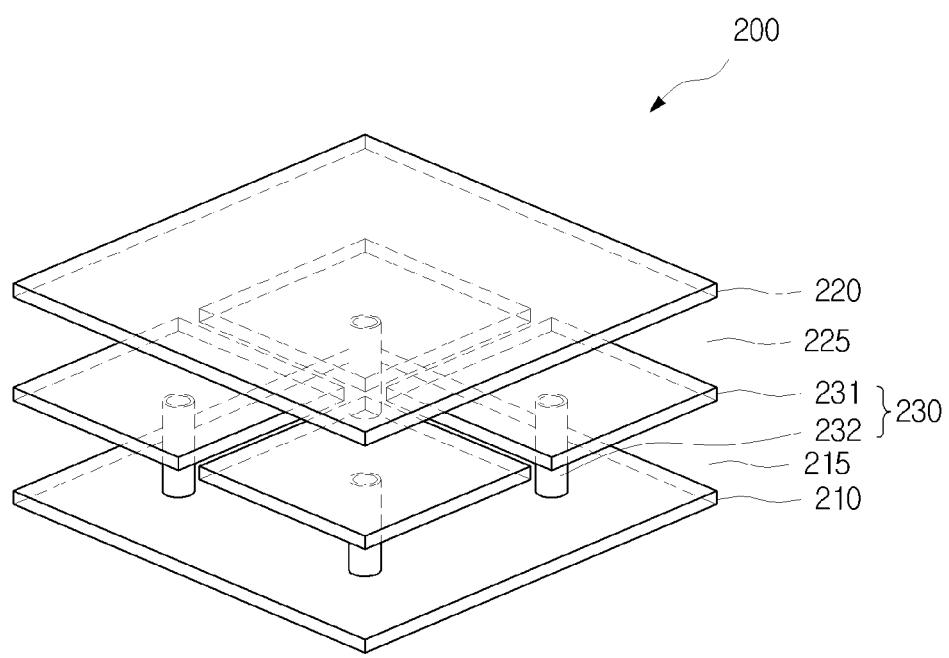
FIG. 2A is an electromagnetic bandgap structure for illustrating an MT-EBG structure.

Firstly, a general form of the MT-EBG is illustrated in FIG. 2A.

The MT-EBG has the structure, for example, in which a plurality of EBG cells (see reference numeral 230 in FIG. 2A) having a mushroom form are interposed between two metal layers that respectively function as a power layer and a ground layer inside a board. FIG. 2A shows only four EBG cells for the convenience of illustration.

Referring to FIG. 2A, the MT-EBG structure 200 additionally forms a metal plate 231 between a first metal layer 210 and a second metal layer 220 that function as one of the ground layer and the power layer and the other of the ground layer and the power layer, respectively, and has a form in which mushroom type structures 230 connecting the first metal layer 210 and the metal plate 231 through a via 232 are repeatedly arranged. Here, a first dielectric layer 215 is interposed between the first metal layer 210 and the metal plate 231, and a second dielectric layer 225 is interposed between the metal plate 231 and the second metal layer 220.

Such MT-EBG structure 200 performs the function of a sort of band stop filter, by having the state in which a capacitance component formed by the second metal layer 220, the second dielectric layer 225 and the metal plate 231 and an inductance component formed by the via 232 penetrating the first dielectric layer 215 and connecting the first metal layer 210 with the metal plate 231 are connected in L-C series between the first metal layer 210 and the second metal layer 220. This can be easily understood through an equivalent circuit schematic diagram shown in FIG. 2B.

Figure 2B:
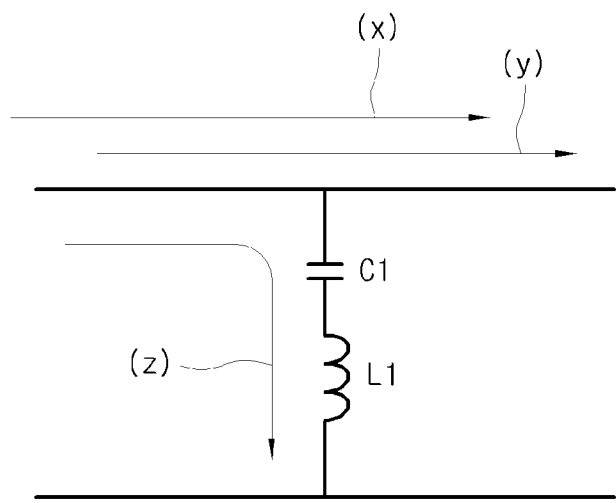
FIG. 2B is an equivalent circuit schematic diagram of the MT-EBG structure shown in FIG. 2A.

Referring to FIG. 2B, by inserting the mushroom type structure 230 between the first metal layer 211 and the second metal layer 212, the MT-EBG structure 200 can allow a signal of a low frequency band (see reference numeral (x) in FIG. 2B) and a signal of a high frequency band (see reference numeral (y) in FIG. 2B) to pass and shield a signal of a particular frequency band (see reference numeral (z) in FIG. 2B) between the low frequency band and the high frequency band.

However, requiring at least three layers, thereby increasing the number of layers, is a structural shortcoming of this MT-EBG structure.

Figure 3A:
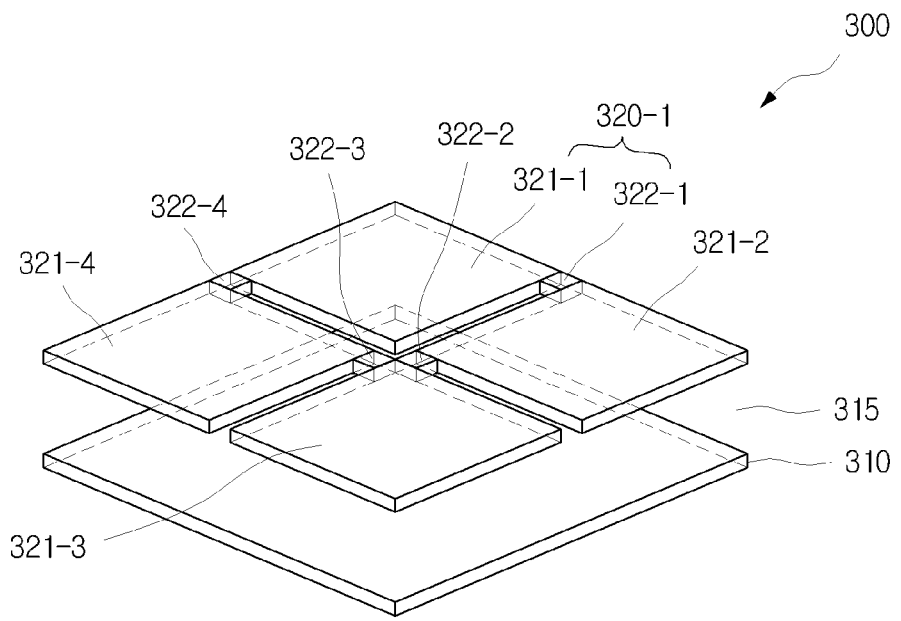
FIG. 3A is an electromagnetic bandgap structure for illustrating a PT-EBG structure.

Next, a general form of the PT-EBG structure is illustrated in FIG. 3A.

The PT-EBG has a structure in which a plurality of EBG cells (see reference numeral 320-1 in FIG. 3A) having a certain pattern are repeatedly arranged throughout any entire metal layer that is to function as the ground layer or the power layer. FIG. 3A also shows only four EBG cells for the convenience of illustration.

Referring to FIG. 3A, the PT-EBG 300 has a form in which a metal layer 310 and a plurality of metal plates 321-1, 321-2, 321-3, 321-4 that are placed on another planar surface are bridged to one another through a certain part of metal plates (a corner of each metal plate in FIG. 3A) by metal branches 322-1, 322-2, 322-3, 322-4.

At this time, the metal plates 321-1, 321-2, 321-3, 321-4 having large areas constitute low impedance fields and the metal branches 322-1, 322-2, 322-3, 322-4 having small areas constitute high impedance fields. Accordingly, the PT-EBG performs the function of a band stop filter that can block a noise in a certain frequency band through the structure in which the low impedance fields and the high impedance fields are alternately repeated. This can be easily understood through an equivalent circuit schematic diagram shown in FIG. 3B.

Figure 3B:
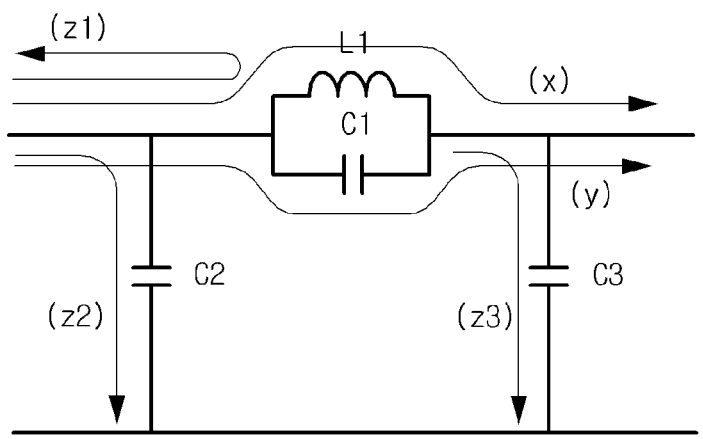
FIG. 3B is an equivalent circuit schematic diagram of the PT-EBG structure shown in FIG. 3A.

Referring to FIG. 3B, by alternating the metal plates 321-1, 321-2, 321-3, 321-4, which constitute the low impedance fields, and the metal branches 322-1, 322-2, 322-3, 322-4, which constitute the high impedance fields on a same planar surface, the PT-EBG structure 300 can allow a signal of a low frequency band (see reference numeral (x) in FIG. 3B) and a signal of a high frequency band (see reference numeral (y) in FIG. 3B) to pass and shield signals of a particular frequency band (see reference numerals (z1), (z2) and (z3) in FIG. 3B) between the low frequency band and the high frequency band.

Unlike the MT-EBG structure, this PT-EBG structure can realize an EBG structure with two layers only. However, designing the PT-EBG structure for application in a variety of products is restricted because it is difficult to reduce the size of a cell and the PT-EBG structure needs to be formed in a wide area. This is because the PT-EBG structure can not utilize various parameters but forms an EBG structure by using two impedance components only.

Meanwhile, the VS-EBG structure, which is exclusively developed by the applicant of the present invention, is realized to overcome the above-described structural shortcoming and design restriction of the MT-EBG structure and PT-EBG structure. The structure of VS-EBG will be described in more detail through this description.

Figure 4A:
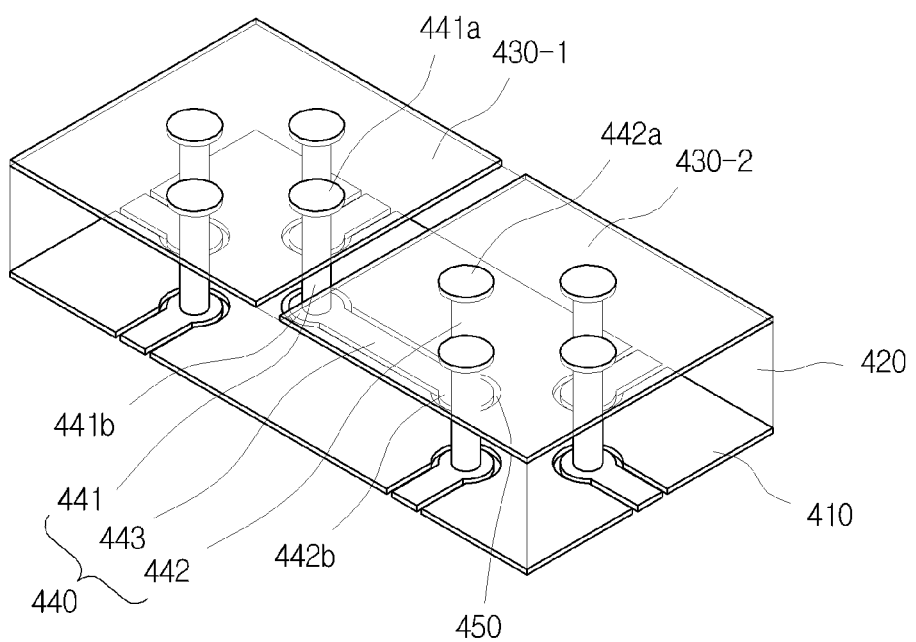
FIG. 4A is an electromagnetic bandgap structure for illustrating an example of a VS-EBG structure.
Figure 4B:
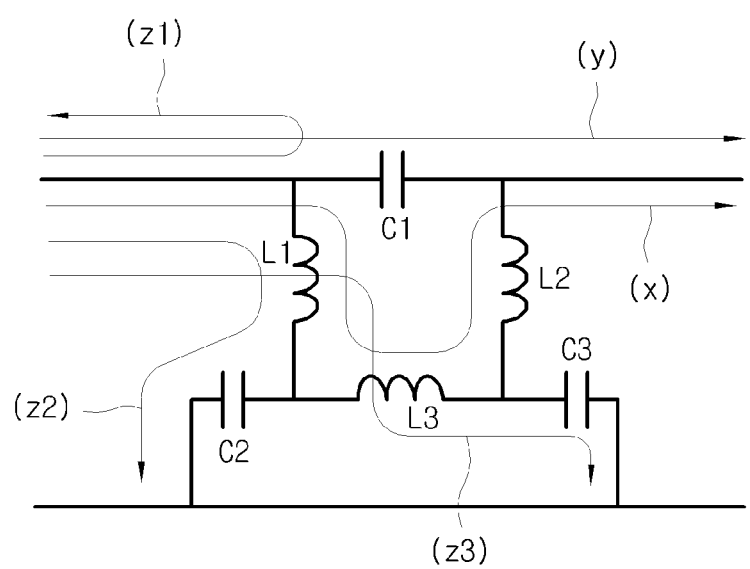
FIG. 4B is an equivalent circuit schematic diagram of the VS-EBG structure shown in FIG. 4A.
Figure 4C:
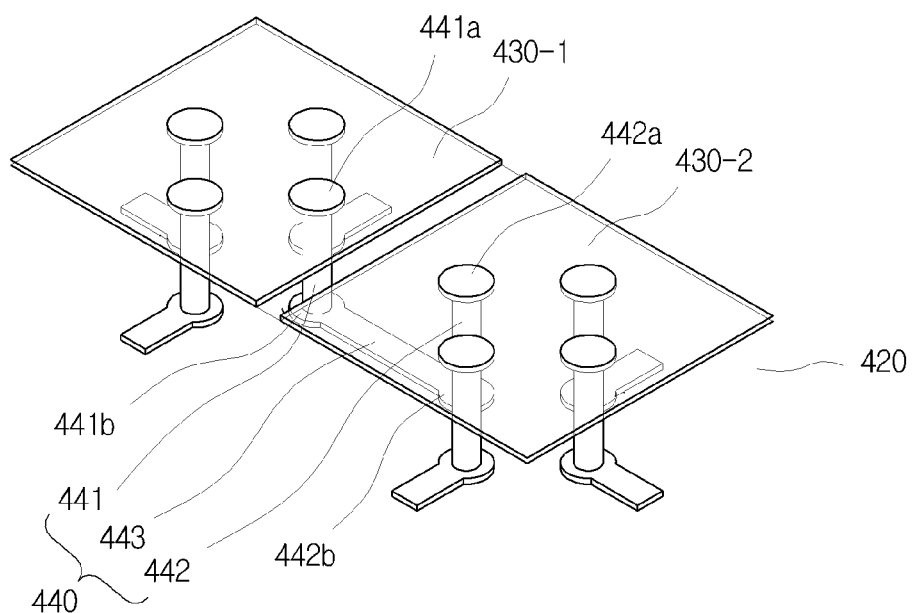
FIG. 4C is an example of modification of the VS-EBG structure shown in FIG. 4A.

FIG. 4A is an electromagnetic bandgap structure for illustrating an example of the VS-EBG structure, and FIG. 4B is an equivalent circuit schematic diagram of the VS-EBG structure shown in FIG. 4A, and FIG. 4C is an example of modification of the VS-EBG structure shown in FIG. 4A. Moreover, FIGS. 5A to 5E illustrate various configurations of EBG cells in the VS-EBG structure.

Referring to FIG. 4A, the VS-EBG structure 400 includes a metal layer 410, a plurality of metal plates (hereinafter, referred to as a first metal plate 430-1 and a second metal plate 430-2), which is spaced apart from the metal layer 410, and a stitching via 440. In FIG. 4A, only two metal plates are illustrated for the convenience of illustration.

The electromagnetic bandgap structure of FIG. 4A has a 2-layered structure in which the metal layer 410 (or the portion where a connection pattern 443 of the stitching via 440 is located) constitutes a first layer and the plurality of metal plates 430-1, 430-2 constitute a second layer. Here, a dielectric layer 420 is interposed between the metal layer 410 and the plurality of metal plates 430-1, 430-2.

Here, the metal layer 410 and the plurality of metal plates 430-1, 430-2 illustrated in FIG. 4A can be any two layers present inside a multi-layered printed circuit board. In the case of FIG. 4A, it is assumed that the metal layer 410 is present at a location corresponding to where the connection pattern 443 of the stitching via 440 is to be formed. However, it is also possible to hypothesize that no metal layer is present where the connection pattern 443 is to be formed, in which case the VS-EBG structure will take the form shown in FIG. 4C.

The metal layer 410 is placed on a planar surface that is different from the planar surface in which the plurality of metal plates 430-1, 430-2 are placed and is electrically separated from the plurality of metal plates 430-1, 430-2. In other words, the metal layer 410 forms a layer in the printed circuit board that is different from the plurality of metal plates 430-1, 430-2 in terms of electrical signals. For example, if the metal layer 410 is a power layer, the metal plates 430-1, 430-2 can be electrically connected to a ground layer. If the metal layer 410 is a ground layer, the metal plates 430-1, 430-2 can be electrically connected to a power layer. Alternatively, if the metal layer 410 is a signal layer, the metal plates 430-1, 430-2 can be electrically connected to a ground layer. If the metal layer 410 is a ground layer, the metal plates 430-1, 430-2 can be electrically connected to a signal layer.

In the VS-EBG structure, the stitching via makes an electrical connection between any two metal plates of a plurality of metal plates. Although all of the accompanying drawings of this specification show that the stitching via electrically connects two adjacent metal plates to each other, the two metal plates connected by the stitching via may not be necessarily adjacent to each other. Also, even though it is shown that one metal plate is connected to another metal plate by one stitching via, it is evidently unnecessary to restrict the number of stitching vias connecting any two metal plates.

Figure 5A:
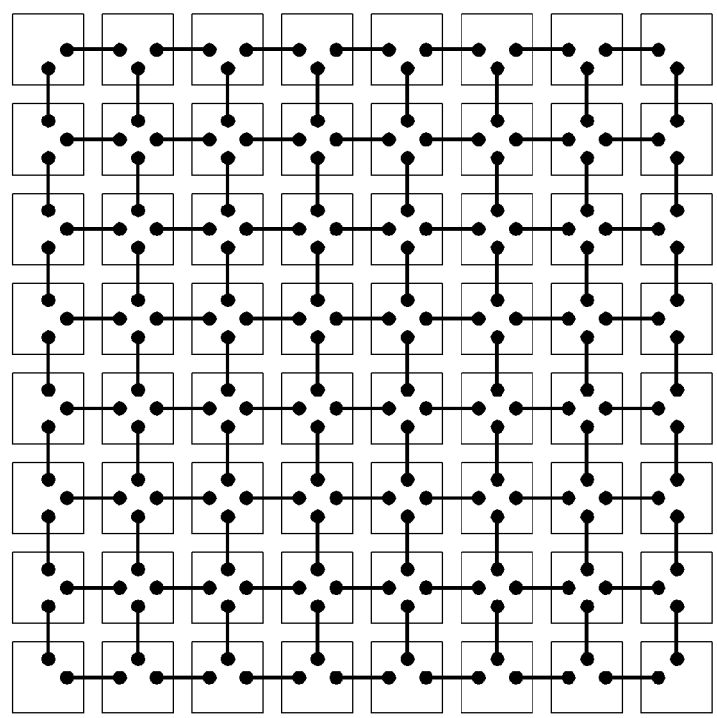
FIG. 5A and FIG. 5B are plan views showing the configuration of VS-EBG structures having rectangular and triangular metal plates, respectively.

Although this specification illustrates that any one metal plate is electrically connected to its adjacent four metal plates through a respective stitching via, eventually making all of the metal plates electrically connected to one another (as shown in FIGS. 4A and 5A), it shall be evident that any other method of making an electrical connection between metal plates through a stitching via can be used as long all metal plates are electrically connected to form a closed loop.

Referring to FIG. 4A, the stitching via is constituted by a first via 441, a second via 442 and the connection pattern 443, thereby functioning to make an electrical connection between two neighboring metal plates.

For this electrical connection, the first via 441 is formed to penetrate the dielectric layer 420 from one end part 441a connected to the first metal plate 430-1, and the second via 442 is formed to penetrate the dielectric layer 420 from one end part 442a connected to the second metal plate 430-2. The connection pattern 443 is placed on the same planar surface as the metal layer 410 and has one end part connected to the other end part 441b of the first via 441 and the other end part connected to the other end part 442b of the second via 442. Here, it shall be evident that a via land having a larger size than the via can be formed at one end part and the other end part of each via in order to reduce a position error in a drilling process for forming the via, and thus the pertinent detailed description will be omitted.

Here, a clearance hole 450 can be formed at an outline of the connection pattern 443 of the stitching via 440 in order to prevent the metal plates 430-1, 430-2 from being electrically connected to the metal layer 410.

The two neighboring metals 430-1, 430-2 are connected not on the same planar surface in the VS-EBG structure but by way of the stitching via 440 and another planar surface (i.e. the same planar surface as the metal layer 410). Accordingly, the VS-EBG structure can acquire an inductance component more easily with a longer length than a structure of connecting neighboring metal plates on the same planar surface under the same conditions. In addition, since the neighboring metal plates of the present invention are connected to each other through the stitching via 440, it is unnecessary to form an additional pattern for electrically connecting the metal plates. This can make a spaced distance between the metal plates narrower. Accordingly, it is possible to increase the capacitance component formed between the neighboring metal plates.

Described below is the principle of how the VS-EBG structure described above functions to shield a signal of a particular frequency band.

In the VS-EBS structure, the dielectric layer 420 is interposed between the metal layer 410 and the metal plates 430-1, 430-2. This causes a capacitance component to be formed between the metal layer 410 and the metal plates 430-1, 430-2 and between the two adjacent metal plates. Also, an inductance component passing through the first via 441→the connection pattern 443→the second via 442 is formed between the two adjacent metal plates by the stitching via 440.

The value of the capacitance component varies according to various factors such as the spaced distances between the metal layer 410 and the metal plates 430-1, 430-2 and between the two adjacent metal plates, the dielectric constant of a dielectric material forming the dielectric layer 420 and the size, shape and area of the metal plate. Also, the value of the inductance component varies according to various factors such as the shape, length, thickness, width and cross-sectional area of the first via 441, the second via 442 and the connection pattern 443. Accordingly, adjusting and designing various aforementioned factors adequately can make it possible to allow the structure of FIG. 4A to function as an electromagnetic bandgap structure (i.e. a kind of a band stop filter) for removing or shielding a particular signal or noise of a target frequency band. This can be easily understood through the equivalent circuit of FIG. 4B.

In the equivalent circuit of FIG. 4B, an inductance component $L1$ corresponds to the first via 441, and an inductance component $L2$ corresponds to the second via 442. An inductance component $L3$ corresponds to the connection pattern 443. $C1$ is a capacitance component by the metal plates 430-1, 430-2 and another dielectric layer and another metal layer to be placed above the metal plates 430-1, 430-2. $C2$ and $C3$ are capacitance components by the metal layer 410 placed on the same planar surface as the connection pattern 443 and another dielectric layer and another metal layer to be placed below the planar surface of the connection pattern 443.

The VS-EBG structure functions as a band stop filter that shields a signal of a particular frequency band according to the above equivalent circuit. In other words, as seen in the equivalent circuit of FIG. 4B, a signal of a low frequency band (represented by (x) in FIG. 4B) and a signal of a high frequency band (represented by (y) in FIG. 4B) pass through the VS-EBG structure, and signals of a particular frequency band (represented by (z1), (z2) and (z3) in FIG. 4B) ranging between the low frequency band and the high frequency band are shielded by the VS-EBG structure.

Figure 5B:
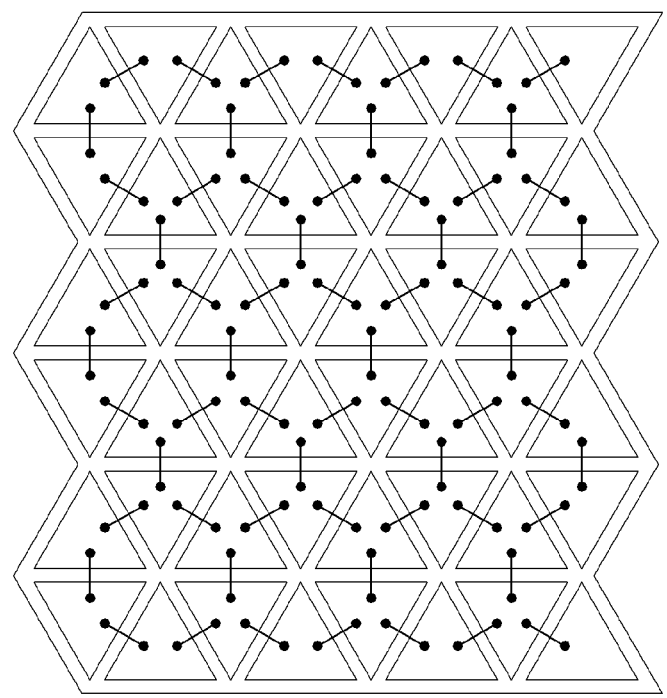
Figure 5C:
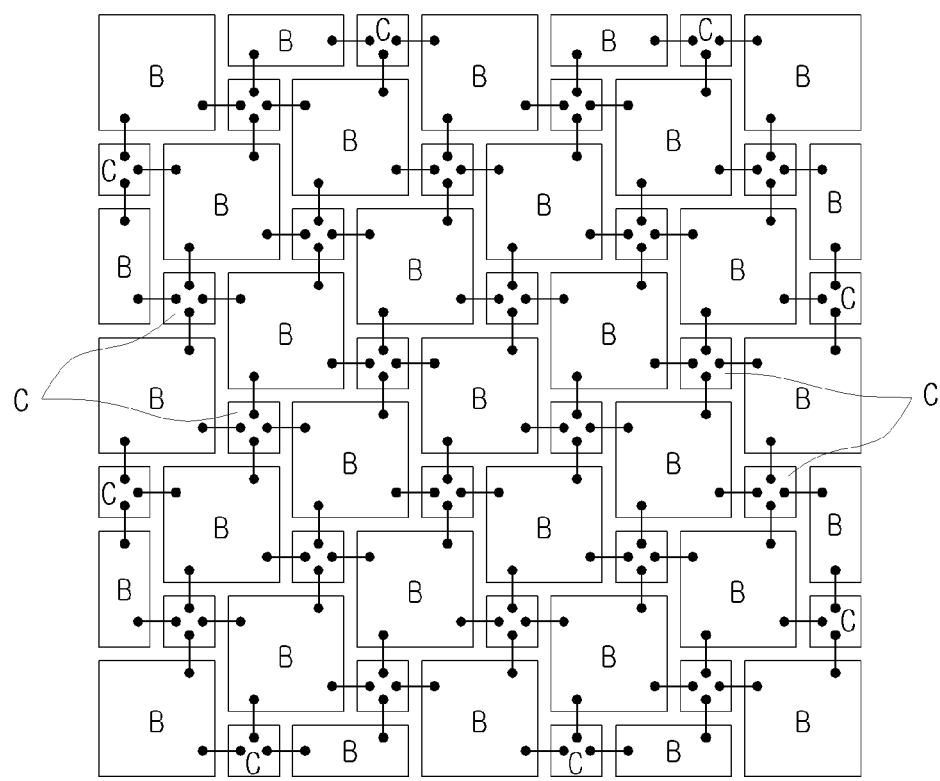
FIG. 5C and FIG. 5D are plan views showing the configuration of a VS-EBG structure having plural groups of different-sized metal plates.
Figure 5D:
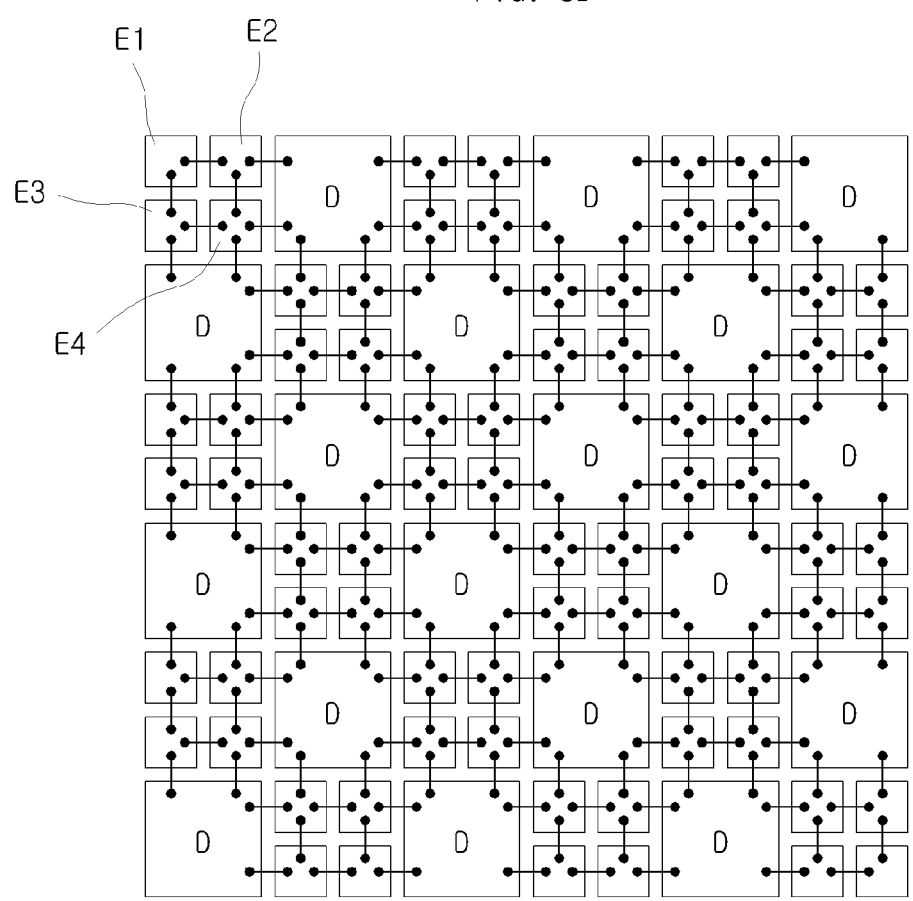

Therefore, by repeatedly arranging the VS-EBG structure throughout a layer inside the board (refer to FIG. 5A. FIG. 5B, FIG. 5C and FIG. 5D) or in a part of a layer inside the board (refer to FIG. 5E), a signal of a particular frequency band can be shielded from being transferred.

Although it has been illustrated that each of the metal plates has a square shape of the same size for the convenience of illustration, it shall be evident that various other modifications are possible. Moreover, the VS-EBG structure can be arranged in various forms. This will be described with reference to FIG. 5A through FIG. 5E.

For example, the metal plates can have various polygonal shapes including not only a rectangle as shown in FIG. 5A and a triangle as shown in FIG. 5B but also a hexagon, an octagon, etc. Of course, it is also possible that the metal plate has a shape of a circle or an ellipse. While the metal plates can have the same size (e.g. area and thickness) as shown in FIG. 5A, FIG. 5B and FIG. 5E, it is possible that the metal plates have different sizes and that a plurality of groups, each of which has the metal plates of a same size, can be arranged according to the size, as shown in FIG. 5C and FIG. 5D.

In the case of FIG. 5C, relatively larger metal plates B and relatively smaller metal plates C are alternately arranged. In the case of FIG. 5D, relatively larger metal plates D and relatively smaller metal plates E1, E2, E3 and E4 are arranged. The smaller metal plates E1, E2, E3 and E4 are grouped in a 2×2 formation, occupying an area that is similar to that of the larger metal plate D.

Figure 5E:
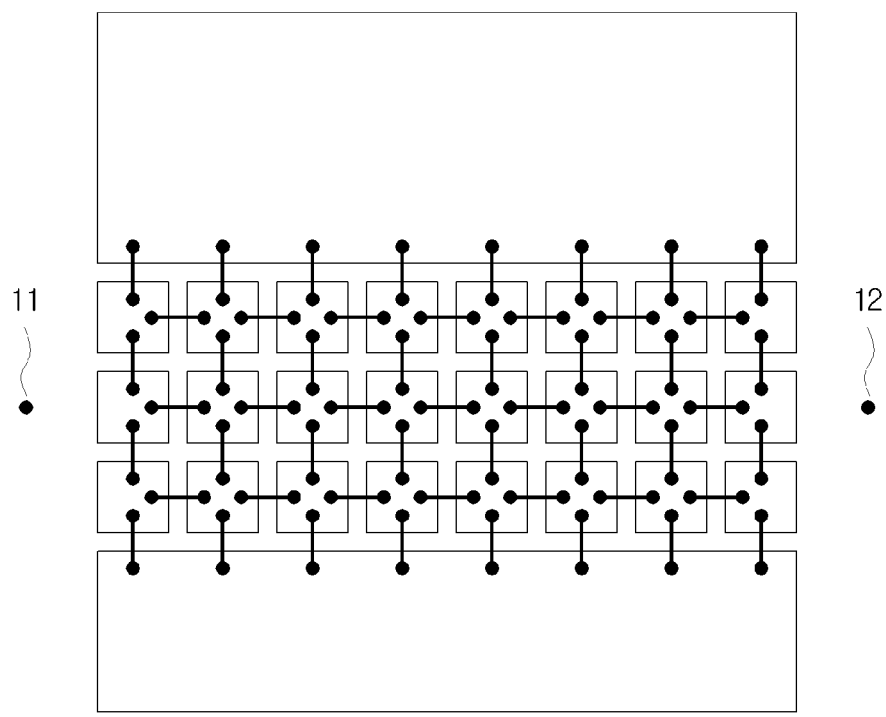
FIG. 5E is a plan view showing a band-shaped configuration of a VS-EBG structure.

In addition, while the cells of the electromagnetic bandgap structures can fill the entire inner surface of the printed circuit board as shown in FIG. 5A through 5D, the cells can be arranged on some paths as shown in FIG. 5E. For example, as shown in FIG. 5E, if it is assumed that a point represented by reference numeral 11 refers to a noise source point and a point represented by reference numeral 12 refers to a noise shield destination point, the cells can be repeatedly arranged in at least one line along a noise transferable path between the noise source point 11 and the noise shield destination point 12. This can be also applied if it is assumed that a point represented by reference numeral 21 refers to the noise source point and a point represented by reference numeral 22 refers to the noise shield destination point.

The EMI noise shield board of the present invention does not aim to shield per se the "conduction noise" that is generated inside the board but aims to prevent the conduction noise from being conducted to a lower surface of the board (referring to a surface where no electronic part is mounted, in this specification) and being radiated to the outside of the board (i.e., to shield the "radiation noise").

Therefore, the electromagnetic bandgap structure to be applied to the EMI noise shield board of the present invention takes a similar structure and feature to the above-described VS-EBG structure while having different arrangement and insertion structure from the arrangement and insertion structure of the above FIGS. 5A to 5E. Hereinafter, any detailed description of structural features that are redundant or substantially similar to the above-described VS-EBG structure will be omitted, but features that are peculiar to the EMI noise shield board in accordance with embodiments of the present invention will be mainly described.

Although the below description will present a board with the VS-EBG structure inserted in a lower side of the board, it shall be evident that the EBG structure to be inserted in the lower side of the board can be the above-described MT-EBG and PT-EBG structures as well as any EMI noise shield structures having identical or similar principles.

Figure 6:
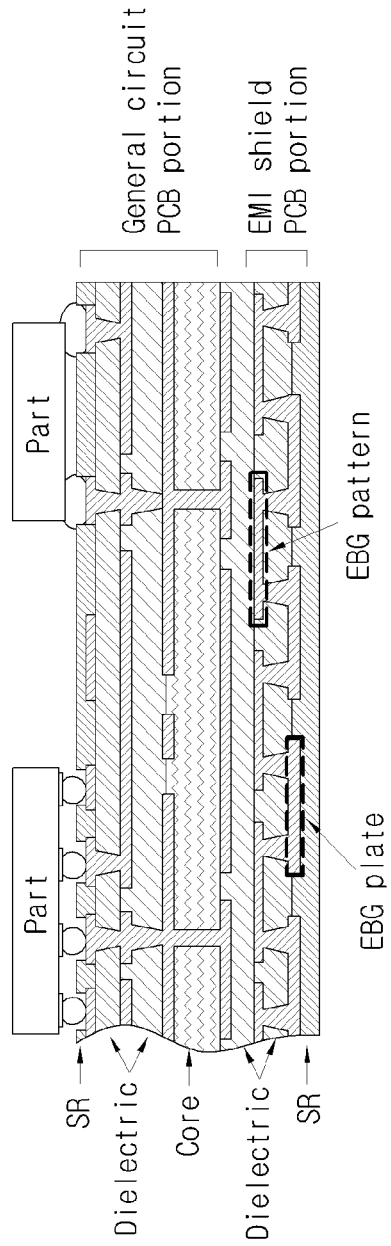
FIG. 6 is a vertical sectional view showing an embodiment of an EMI noise shield board in which an EBG structure is inserted in accordance with the present invention.
Figure 7:
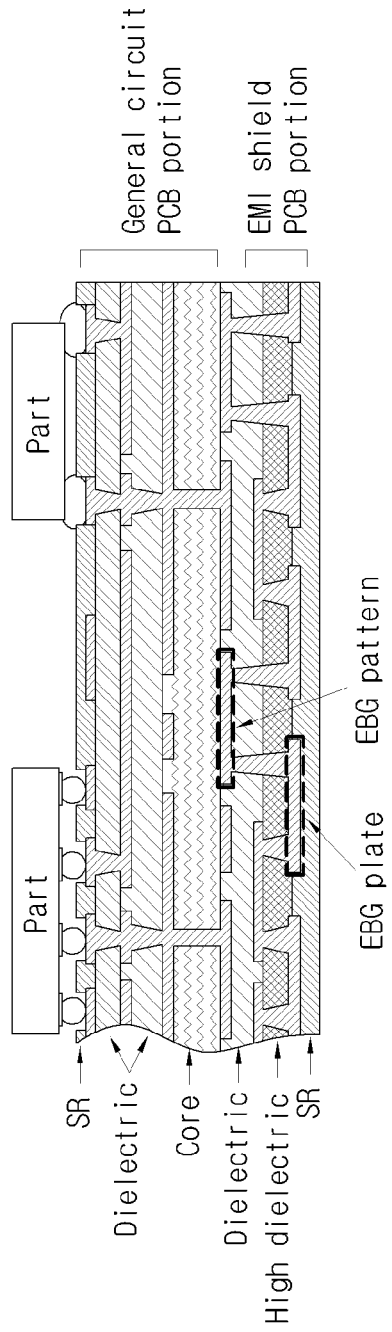
FIG. 7 is a vertical sectional view showing another embodiment of an EMI noise shield board in which an EBG structure is inserted in accordance with the present invention.
Figure 8:
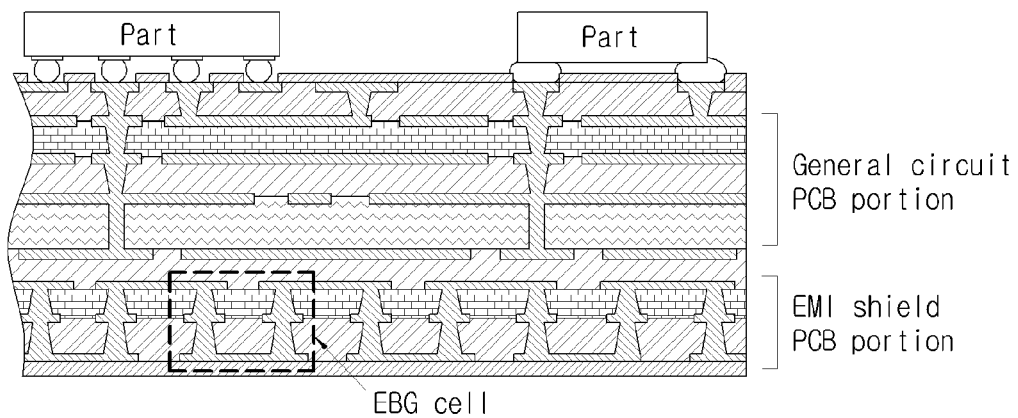
FIG. 8 is a vertical sectional view showing yet another embodiment of an EMI noise shield board in which an EBG structure is inserted in accordance with the present invention.

FIG. 6 is a vertical sectional view showing an embodiment of an EMI noise shield board in which an EBG structure is inserted in accordance with the present invention, and FIG. 7 is a vertical sectional view showing another embodiment of an EMI noise shield board in which an EBG structure is inserted in accordance with the present invention, while FIG. 8 is a vertical sectional view showing yet another embodiment of an EMI noise shield board in which an EBG structure is inserted in accordance with the present invention.

The EMI noise shield board of the present invention is functionally constituted by two main parts, as shown in FIGS. 6 to 8.

Specifically, the EMI noise shield board in accordance with the present invention includes a general circuit PCB portion ("first board portion" hereinafter), which is mounted by an electronic part on its upper surface and formed with a circuit for transferring a signal and power to the electronic part, and an EMI-shielding PCB portion ("second board portion" hereinafter), which is located on a lower surface of the first board portion and preventing an EMI noise transferred from the first board portion from being radiated to the outside of the board.

For this, an EBG structure described above with reference to FIGS. 2A to 4C can be inserted in the second board portion. However, the embodiments of FIGS. 6 to 8 illustrate the case of the above-described VS-EBG structure inserted in the second board portion.

That is, in FIGS. 6 to 8, the EBG structure inserted in the second board portion can have a VS-EBG structure including a plurality of conductive plates (see EBG plates and EBG cells shown in FIGS. 6 to 8), which are located in a first planar surface, and stitching vias, which electrically connect two neighboring conductive plates with each other.

Therefore, the stitching vias can include a first via, which penetrates a dielectric layer and has one end connected with one of the two neighboring conductive plates, a second via, which penetrates the dielectric layer has one end connected with the other of the two neighboring conductive plates, and a conductive connection pattern, which is located in a different planar surface from the conductive plates and has one end connected with the other end of the first via and the other end connected with the other end of the second via.

Here, while every conductive plate constituting each EBG cell inserted into the second board portion can be made in the same shape, area and size, it shall be evident that some conductive plates can be made to have at least one of the shape, area and size that is different from the rest of the conductive plates, depending on the bandgap frequency band of the EMI noise to be shielded or the EMI noise shield level, as described earlier.

Particularly, in forming the EBG structure, the conductive plates can be arranged at a farther location from the upper surface of the first board portion on which the electronic part is mounted, compared to the location where the conductive connection pattern is formed in the second board portion. For example, referring to FIGS. 6 to 8, the conductive plates (i.e., the EBG plates) constituting each EBG cell of the EBG structure are located at the lower-most part of the second board portion (that is, the lower-most surface of the entire EMI noise shield board). In other words, in FIGS. 6 to 8, the EBG structure illustrated in FIG. 4C is turned upside down.

Moreover, it shall be evident that the conductive connection pattern can be made in various trace shapes, including a straight line, a curved line, a spiral shape, etc., depending on the bandgap frequency band of the EMI noise to be shielded or the EMI noise shield level.

Here, the dielectric layer interposed between the conductive plates and the conductive connection pattern can be formed by a highly dielectric substance (i.e., a high dielectric) for improvement of the EMI shielding property (see FIG. 7).

As illustrated in FIG. 7, in the EBG structure, the conductive connection pattern can be placed on one planar surface inside the first board portion while the conductive plates are placed inside the second board portion. Alternatively, the conductive connection pattern can be placed at an interface between the first board portion and the second board portion. As such, when the conductive connection pattern is placed at the interface of the first board portion or inside the first board portion, the lengths of the vias electrically connecting the conductive plates and the conductive connection pattern with one another (i.e., the first via and the second via constituting the stitching vias) can be increased, thereby proportionally increasing the inductance value.

Generally, the EBG structure to be inserted into the second board portion can be formed in a two-layer structure, in which the conductive plates form a first layer and the conductive connection pattern forms a second layer, as illustrated in FIG. 6, in order to minimize the thickness of the second board portion.

However, the present invention is not restricted to the above structure, and it is possible that the EBG structure is made to have 3 or more layers if the thickness of the board is not much of a design issue or if it is required according to the bandgap frequency band of the EMI noise to be shielded and/or the noise shield level (see FIG. 8).

Alternatively, by repeatedly stacking the two-layer EBG structure in the direction of the thickness (i.e., in the direction of the height), it would be possible to make the EBG structure have any even-numbered layer structure.

Furthermore, it shall be evident that the EBG structure can be arranged in various forms as described earlier with reference to FIGS. 5A to 5E. As described earlier, it is possible that the EBG structure is arranged throughout the second board portion or at some of the second board portion in order to prevent the EMI noise transferred from the first board portion from being radiated to the outside.

For example, in case the EBG structure is arranged at some portion of the second board portion, the some portion can be selected to include a major transfer path of the EMI noise transferred from the first board portion, for example, a transfer path related to a portion at which the EMI noise is mainly radiated.

Although FIGS. 6 to 8 illustrate that the EBG structure is inserted into one portion (that is, the second board portion) of the lower surface of the first board portion, it is also possible that the EBG structure is inserted into two or more portions.

In other words, there can be an additional third board portion on a lower surface of the second board portion, and the EBG structure can be inserted and arranged in the third board portion in the same way as described above. In this case, by having double or triple shield portions, it becomes possible to shield the radiation of the EMI noise more tightly.

Figure 9:
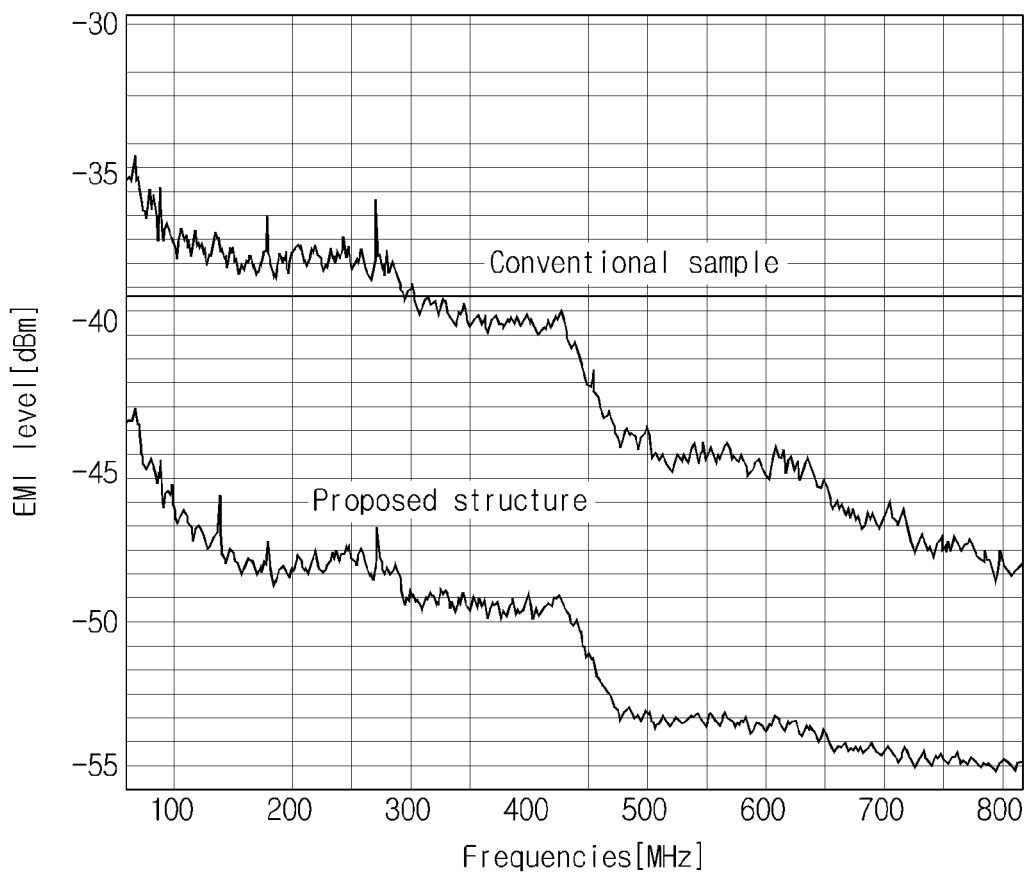
FIG. 9 is a graph showing the EMI noise shield property of an EMI noise shield board in which an EBG structure is inserted in accordance with the present invention.

FIG. 9 is a graph showing the EMI noise shield property of an EMI noise shield board in which an EBG structure is inserted in accordance with the present invention.

In the graph shown in FIG. 9, the conventional sample illustrates the case of a PCB having a general circuit PCB portion only, and the proposed structure illustrates a PCB having an EMI shield PCB portion on a lower surface of the general circuit PCB portion.

Referring to the graph in FIG. 9, it can be seen that an EMI noise shield board having a PCB portion in which an EBG structure is inserted in accordance with the proposed structure has a less EMI noise than the conventional sample by about 10 dB at 100 to 800 MHz band.

As such, according to the present invention, the radiation noise radiated to the outside through a surface where no electronic part is mounted can be shielded by the EMI noise shield board having the EMI shield PCB portion in which the EBG structure is inserted.

While the spirit of the invention has been described in detail with reference to certain embodiments, the embodiments are for illustrative purposes only and shall not limit the invention. It is to be appreciated that those skilled in the art can change or modify the embodiments without departing from the scope and spirit of the invention.

What is claimed is:
1. An EMI noise shield board, comprising:
  a first board portion having an upper surface on which an electronic part is disposed, and including a circuit for transferring a signal and power to the electronic part; and
  a second board portion located below the first board portion, an electromagnetic bandgap structure being dis- posed inside the second board portion, the electromagnetic bandgap structure having a band stop frequency property such that an EMI noise transferred from the first board portion is shielded from being radiated to the outside of the EMI noise shield board; and a third board portion located on a lower surface of the second board portion, a further electromagnetic bandgap structure being disposed inside the third board portion, the further electromagnetic bandgap structure having a band stop frequency property such that an EMI noise transferred from the second board portion is shielded from being radiated to the outside of the EMI noise shield board, wherein:

the electromagnetic bandgap structure comprises a plurality of conductive plates located on a first planar surface and stitching vias electrically connecting two neighboring conductive plates with each other, the stitching vias comprise:
  a first via penetrating a dielectric layer and having one end connected with one of the two neighboring conductive plates;
  a second via penetrating a dielectric layer and having one end connected with the other of the two neighboring conductive plates; and
  a conductive connection pattern located on a second planar surface that is different from the conductive plates, one end of the conductive connection pattern being connected with the other end of the first via and the other end of the conductive connection pattern being connected with the other end of the second via, the conductive plates are located inside the second board portion, and the conductive connection pattern is located at an interface between the first board portion and the second board portion or on one planar surface inside the first board portion.

2. The EMI noise shield board of claim 1, wherein the first planar surface on which the conductive plates are located is located farther away from an upper surface of the first board portion on which the electronic part is mounted than a planar surface on which the conductive connection pattern is located in the second board portion.

3. The EMI noise shield board of claim 1, wherein the dielectric layer being penetrated by one of the first via and the second via is formed by a high dielectric.

4. The EMI noise shield board of claim 1, wherein:
the electromagnetic bandgap structure has a two-layer structure in which the first planar surface on which the conductive plates are located forms a first layer and the planar surface on which the conductive connection pattern is located forms a second layer; and
the electromagnetic bandgap structure having the two-layer structure is expanded in any even-numbered layer structure by being stacked in the direction of height inside the second board portion.

5. The EMI noise shield board of claim 1, wherein the electromagnetic bandgap structure has a structure with at least three layers by interposing at least one conductive layer between the first planar surface on which the conductive plates are located and the planar surface on which the conductive connection pattern is located.

6. The EMI noise shield board of claim 1, wherein some of the conductive plates have at least one of an area, a shape and a size that is different from that of the rest of the conductive plates.

7. The EMI noise shield board of claim 1, wherein the conductive plates are arranged throughout the entire second board portion.

8. The EMI noise shield board of claim 1, wherein:
the conductive plates are arranged at some portion of the second board portion; and
the some portion of the second board portion in which the conductive plates are arranged includes a major transfer path of the EMI noise transferred from the first board portion.

* * * * *